United States Patent [19]

Principe et al.

[11] Patent Number: 5,301,135
[45] Date of Patent: Apr. 5, 1994

[54] ADAPTIVE FILTER BASED ON A RECURSIVE DELAY LINE

[75] Inventors: Jose C. Principe, Gainesville, Fla.; Bert de Vries, Princeton, N.J.

[73] Assignee: University of Florida, Gainesville, Fla.

[21] Appl. No.: 954,473

[22] Filed: Sep. 30, 1992

[51] Int. Cl.⁵ .................................. G06F 15/31
[52] U.S. Cl. ..................... 364/724.17; 364/724.19
[58] Field of Search .............. 364/724.17, 724.19, 364/724.2, 724.16

[56] References Cited

U.S. PATENT DOCUMENTS 5,130,943 7/1992 Gazsi et al. ............... 364/724.19

Primary Examiner—David H. Malzahn
Attorney, Agent, or Firm—Needle & Rosenberg

[57] ABSTRACT

An adaptive recursive filter for filtering electronic signals is disclosed. The filter comprises a plurality of cells connected sequentially. Each cell comprises a delay element; a means to multiply the output of the delay element by a first adaptive parameter, thus creating an adaptive feedback signal; a means to multiply the input to the cell by a second adaptive parameter, thus creating an adaptive input signal; and a first summation means to add the adaptive feedback signal to the adaptive input signal. The output gain of each cell is further multiplied by an adaptive weighing factor and all of the thus-created adaptively modified cell output gains are added together linearly by a plurality of second summation elements thus producing the output of the filter.

This filter is characterized by a fully adaptive set of coefficients, an impulse response length decoupled from its order, and easily enforced stability conditions.

6 Claims, 2 Drawing Sheets

ADAPTIVE FILTER BASED ON A RECURSIVE DELAY LINE

The subject invention has been developed in part with the aid of a grant from the National Science Foundation under Contract # ECS-8915218 with the title "Microelectric Biosensor for Neural Tissue Data Collection." The National Science Foundation contributed 25% toward the cost of developing this invention.

BACKGROUND OF THE INVENTION

This invention relates to a digital filter used in applications such as signal processing and control systems and, more particularly, to a recursive filter whose transfer function adapts to the operating environment of the filter.

Electronic filters have a variety of uses, including: echo cancellation in telecommunications, control systems, and signal noise reduction. The basic electronic filter allows a preselected frequency bandwidth to be transmitted by the filter, while attenuating all other bandwidths.

Heretofore various digital and recursive filters have been developed. See, for example, U.S. Pat. Nos. 4,305,133; 4,811,263; 4,920,507; 4,920,530; 4,928,258; 5,014,232; and 5,089,981.

There are two broad categories of electronic filters, Finite Impulse Response (FIR) filters and Infinite Impulse Response (IIR) filters. FIR filters are built around a series of unit delay elements connected so that the first delay element delays the input signal by one time unit, the second delay element delays the input signal by another time unit, and so on, until the input signal coming out of the final delay element is delayed by the number of time units equal to the number of delay elements in the series. A copy of the output of each delay element is tapped out and multiplied by a predetermined weighting factor. The weighted outputs from all of the delay elements are serially added using summation elements. The output of the last summation element in the series is the output of the filter.

The FIR filter is characterized by an output that stays within finite bounds when responding to a unit impulse function input. FIR filters are inherently stable, but as one grows in complexity its response time slows proportionately.

The IIR filter also utilizes a delay element. However, it feeds back a copy of the output from the delay element, multiplied by a predetermined feedback parameter, to the input of the delay element. This creates a recursive filter. The IIR filter has a rapid response time, but is not inherently stable.

Adaptive filters are filters with circuitry that determines the difference between desired output and actual output and then influences the circuitry of the filter to correct for the difference between the actual output and the desired output of the filter. An adaptive FIR filter multiplies the tapped output of the delay elements by adaptive weighting factors. This type of filter is relatively stable and exhibits a relatively small error. However, it is limited by many of the same limitations of the conventional FIR filter.

An improvement on the adaptive FIR filter is a partially adaptive IIR filter. One example of this type of filter is disclosed in U.S. Pat. No. 5,014,232. However, because the feedback of the filter is not modified by any adaptive parameters, the output of the filter is not fully optimal and the signal output error is not minimized. The filter disclosed therein uses a series of IIR filter cells, the outputs of which are each multiplied by an adaptive weighting factor, which brings the actual output of the filter more closely in line with the desired output.

SUMMARY OF THE INVENTION

The present invention provides an improved adaptive filter that is based on a recursive delay line. More particularly, this is achieved by placing an adaptively modified feedback loop around the delay elements of each cell. The input to the cell and the feed-back output of the delay element are each multiplied by adaptive parameters ($\mu$ and $1-\mu$, respectively) that determine the response time and the stability of the filter. These adaptive signals are added through a summation element and are then input to the delay element. The output of each cell, the gain signal, is multiplied by an adaptive weighting factor. These weighted cell output signals are then added linearly by a summation element, thus forming the filter's output.

Therefore, it is an object of the present invention to provide an adaptive IIR filter that has easily established stability conditions ($0 < \mu < 2$).

It is another object of the invention to provide an adaptive filter where its memory depth is not coupled to its order, as in an FIR filter.

Furthermore, it is an object of the present invention to provide a fully adaptive solution to signal processing problems, thus minimizing the mean signal output error of the filter.

DETAILED DESCRIPTION OF THE INVENTION

The preferred embodiment is now described with reference to the figures.

Figure 1:
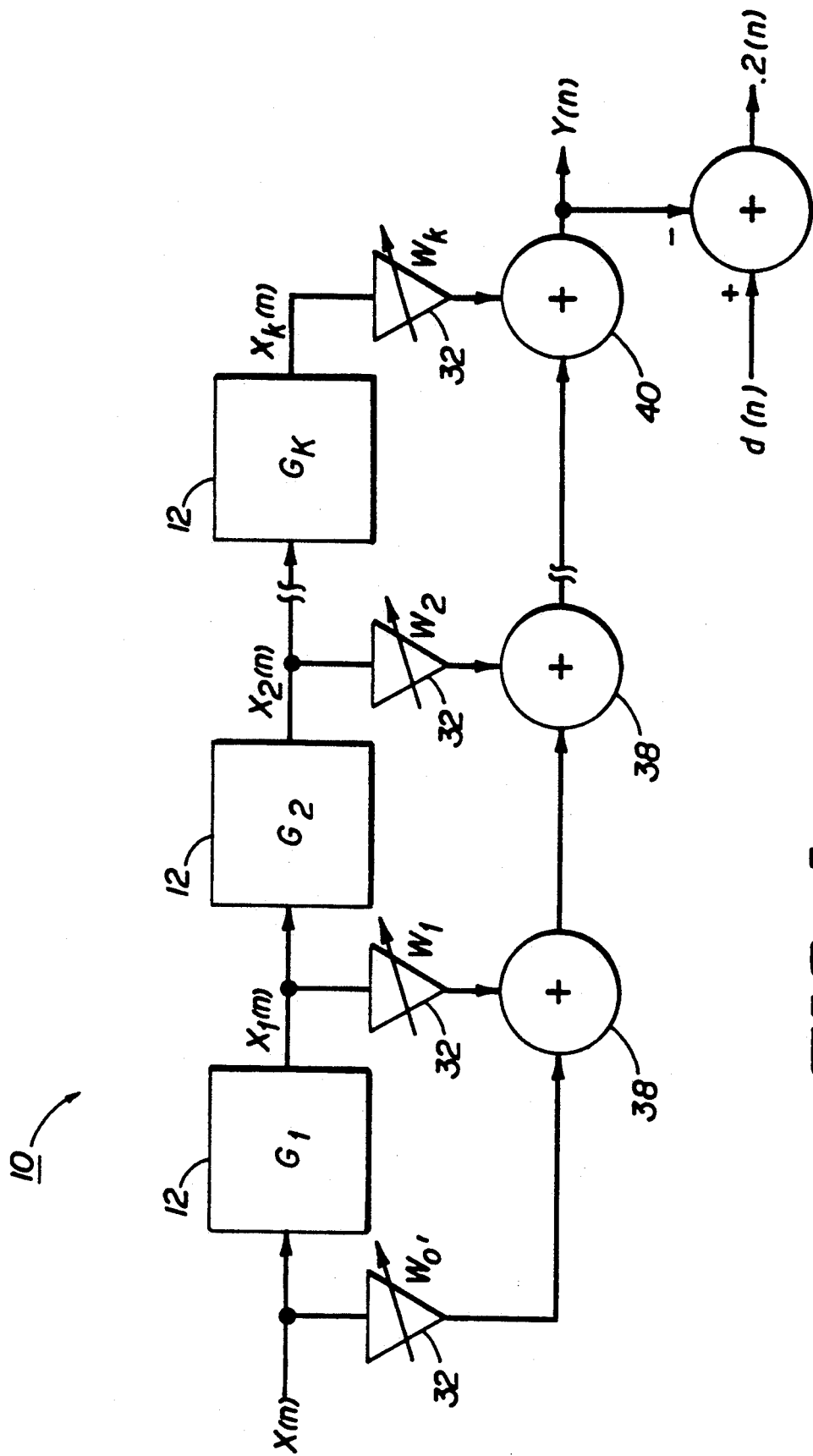
FIG. 1 is a block diagram of a preferred embodiment of this invention.

The adaptive filter 10 is shown in FIG. 1 as receiving a discrete input signal, $x(n)$, and generating a discrete output signal, $y(n)$. The filter 10 comprises a plurality of cells 12 connected in a linear cascade. Each cell $G_1$-$G_k$ is a delay means, such as described in more detail below, of which the first cell processes input $x(n)$ and of which the subsequent cells $G_n$ have as an input the output of the previous cell $G_{n-1}$ in sequence. The input $x(n)$ is also multiplied in a multiplier 32 by an adaptive weighting factor $W_o$. Also, the outputs of each of the cells $G_1$-$G_k$ are each multiplied in multiplier 32 by an associated adaptive weighting factor $W_1$-$W_k$. The outputs of all of the multipliers 32 are added together by summing means 38, with the resultant signal constituting the adaptive filter output signal $y(n)$.

Figure 2:
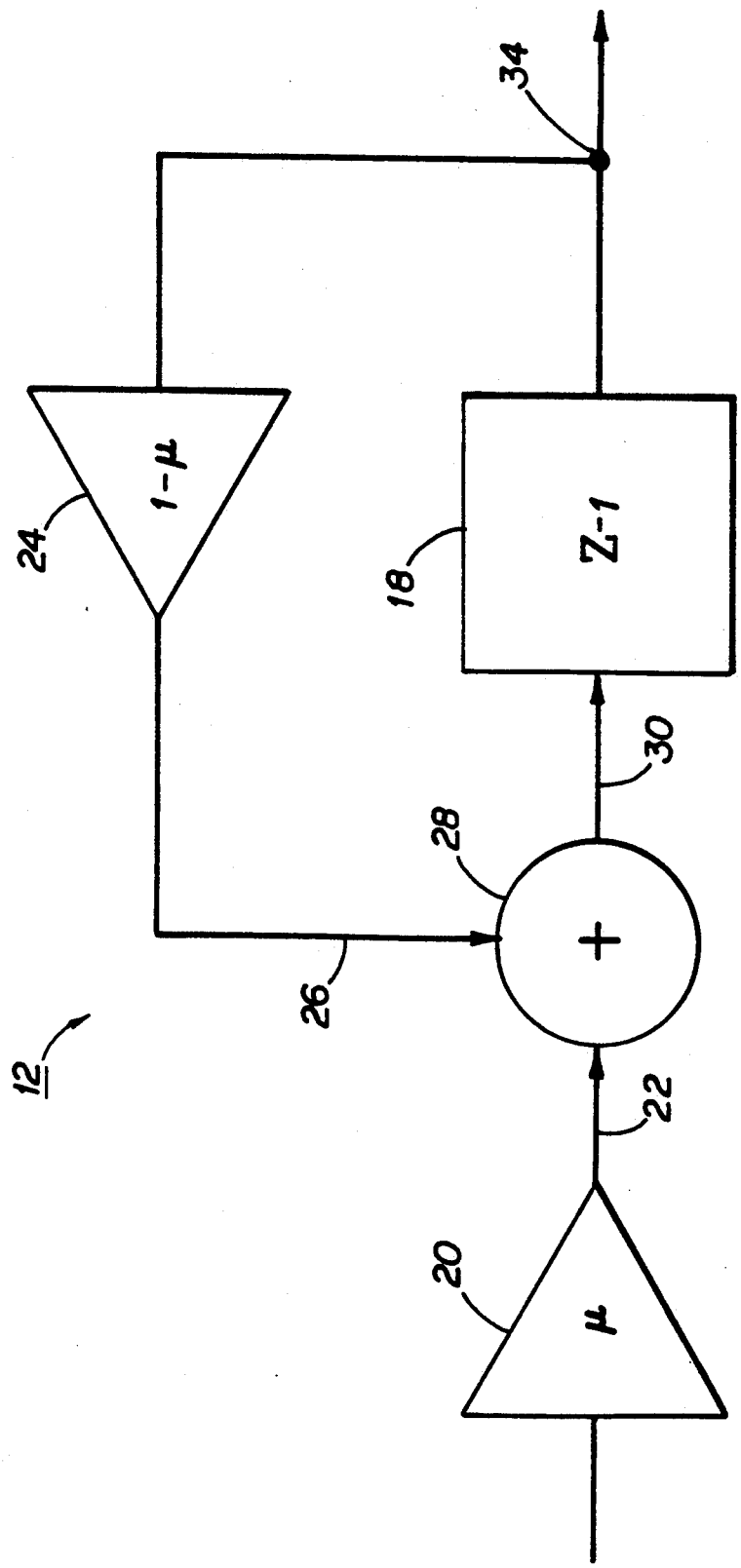
FIG. 2 is a logic element diagram of a single cell of FIG. 1.

As shown in FIG. 2, each cell 12 ($G_1$-$G_k$) contains a unit delay element 18, a multiplier 20 to multiply the input to each cell by an adaptive parameter $\mu$, another multiplier 24 to multiply the output of the delay element 18 by an adaptive parameter equal in value to $1-\mu$ to provide an adaptive feedback signal. The output signals of the multipliers 20 and 24 are added together in summation means 28 to provide the signal input to the delay element 18.

In the adaptive signal processing, the filter weights are updated to minimize an error criteria in accordance with a least mean square error calculation. The updates to the adaptive parameters $W_k$ and $\mu$ are the calculated according to the following formulas:

$$\Delta W_k(n) = \eta\, e(n)\, x_k(n)$$

and $$\Delta \mu(n) = \eta\, e(n) \sum_{k=0}^{K} W_k\, a_k(n)$$

where e(n) is the difference between a desired signal d(n) and the filter output y(n) (see FIG. 1); where $\eta$, the step size, is a small constant (e.g. in the range of 0.01 to 0.1) dependent upon the input signal characteristics; where $x_k(n)$ are the filter tap outputs of each of the cells $G_1$-$G_k$; and where $$a_0(n)=0$$

$$a_k(n)=(1-\mu)a_k(n-1)$$

$$+\mu a_{k-1}(n-1)=x_{k-1}(n-1)-x_k(n-1), \text{ for } k=1,\ldots,K.$$

In practice, the filter may be implemented digitally, where the delay elements comprise digital memory, such as a plurality of digital registers, and a computer is programmed to execute the adaptive filter equations. Of course, the adaptive filter may be implemented in a specially designed integrated circuit chip.

While the invention has been described in detail with particular reference to the preferred embodiment thereof, it will be understood that variations and modifications in the feedback loop around the delay element of each cell can be effected within the spirit and scope of the invention as previously described and as defined by the claims.

What is claimed is:

1. An adaptive recursive filter for filtering an electronic signal, comprising:
   a. a plurality of cells connected sequentially, each cell further comprising:
      i) delay means for delaying a signal input to said delay means for a predetermined delay period before the signal is output from said cell;
      ii) first means for multiplying the input to said cell by a value equal to an adaptive parameter, thus creating an adaptive input signal;
      iii) second means for multiplying the output of said delay element by a value equal to one minus said adaptive parameter, thus creating an adaptive feedback signal; and
      iv) summation means for adding said adaptive feedback signal to said adaptive input signal, thus creating an input to said delay means,
   wherein the electronic signal is input to the first cell in the sequence of cells and the signal input to each succeeding cell is the output signal from the previous cell in sequence;
   b. a plurality of third multiplication means, each associated with one of said cells or with the electronic signal input to said filter, for multiplying the output signal of each associated said cell or electronic signal by a corresponding adaptive multiplication factor; and
   c. summation means for adding together the adaptively multiplied output signals of each of said third multiplication means, the sum of which is the output signal of the adaptive recursive filter.

2. The adaptive filter of claim 1 implemented using digital means.

3. The adaptive filter of claim 2 implemented on a digital signal processing computer.

4. The adaptive filter of claim 2, wherein said delay means comprises a plurality of digital registers.

5. The adaptive filter of claim 1, wherein said adaptive parameter, $\mu$, and said adaptive multiplication factors, $W_k$, are determined based upon the difference, e(n), between a desired signal, d(n), and the output signal of the adaptive filter, y(n).

6. The adaptive filter of claim 5, wherein said adaptive parameter, $\mu$, is continually adjusted between the values zero and two by the value $\Delta\mu$, and said adaptive multiplication factors, $W_k$, are each continually updated by the respective values $\Delta W_k$ calculated for each update iteration as:

$$\Delta W_k(n) = \eta\, e(n)\, x_k(n)$$

and $$\Delta \mu(n) = \eta\, e(n) \sum_{k=0}^{K} W_k\, a_k(n)$$

where $\eta$ is a small constant; where $x_k(n)$, for $k=1,\ldots,k$, are the outputs of each of said cells; where $x_o(n)$ is the input signal to the adaptive filter; and where $$a_0(n)=0$$

$$a_k(n)=(1-\mu)a_k(n-1)$$

$$+\mu a_{k-1}(n-1)=x_{k-1}(n-1)-x_k(n-1), \text{ for } k=1,\ldots,K.$$

* * * * *